(12) United States Patent
Salmon

(10) Patent No.: US 7,254,024 B2
(45) Date of Patent: Aug. 7, 2007

(54) COOLING APPARATUS AND METHOD

(76) Inventor: Peter C. Salmon, 200 E. Dana St., #8, Mountain View, CA (US) 94041

(*) Notice: Subject to any disclaimer, the term of this patent is extended or adjusted under 35 U.S.C. 154(b) by 299 days.

(21) Appl. No.: 11/101,934

(22) Filed: Apr. 8, 2005

(65) Prior Publication Data

US 2005/0254214 A1 Nov. 17, 2005

Related U.S. Application Data

(60) Provisional application No. 60/570,199, filed on May 11, 2004.

(51) Int. Cl.
*H05K 7/20* (2006.01)

(52) U.S. Cl. ............... 361/699; 361/689; 257/714; 165/80.4; 165/104.33

(58) Field of Classification Search ............... None
See application file for complete search history.

(56) References Cited

U.S. PATENT DOCUMENTS

| | | | |
|---|---|---|---|
| 4,748,495 A | 5/1988 | Kucharek | |
| 5,001,548 A | 3/1991 | Iversen | |
| 5,159,529 A | 10/1992 | Lovgren et al. | |
| 5,162,974 A | 11/1992 | Currie | |
| 5,239,200 A | 8/1993 | Messina et al. | |
| 5,305,184 A * | 4/1994 | Andresen et al. | 361/699 |
| 6,208,511 B1 * | 3/2001 | Bortolini et al. | 361/698 |
| 6,304,447 B1 * | 10/2001 | Bortolini et al. | 361/699 |
| 6,587,345 B2 * | 7/2003 | Chu et al. | 361/719 |
| 6,763,880 B1 | 7/2004 | Shih | |
| 6,938,678 B1 * | 9/2005 | Bortolini et al. | 165/80.4 |
| 6,955,063 B2 | 10/2005 | Adiga et al. | |
| 7,040,383 B2 * | 5/2006 | Oyamada | 165/104.33 |
| 2006/0209512 A1 * | 9/2006 | Taniguchi et al. | 361/699 |

* cited by examiner

*Primary Examiner*—Boris Chervinsky
(74) *Attorney, Agent, or Firm*—Dorsey & Whitney LLP

(57) ABSTRACT

A Micro Blade is described for implementing an electronic assembly having a thin profile; it is a miniaturized stand-alone unit that is mechanically and thermally rugged, and connects to external components using a cable. The electronic assembly is preferably fabricated on a copper foil substrate including an interconnection circuit, a special assembly layer, and directly attached components. The components are preferably in bare die form, and are preferably attached using plated copper spring elements inserted into wells filled with solder. The copper foil substrate may be folded to form a compact system in package (SIP) inside of the Micro Blade. A jacket comprised of thermally conductive members is formed around the electronic assembly using hermetic seams. The Micro Blade is preferably cooled by immersion in water contained in a tank; the water is cooled and circulated using an external pumping system.

4 Claims, 7 Drawing Sheets

COOLING APPARATUS AND METHOD

RELATED APPLICATIONS

This application claims priority to Provisional Application Ser. No. 60/570,199 filed May 11, 2004.

THE INVENTION

This invention relates to cooling of electronic components and systems, and more particularly to a thermal architecture for liquid cooling of electronic sub-assemblies connected to a motherboard or backplane.

BACKGROUND OF THE INVENTION

Blade components have a characteristic form factor; they have a thickness dimension substantially smaller that their height and width. This provides a convenient packaging arrangement for a large system, wherein multiple blades can be inserted in slots in a chassis, each blade providing a standalone capability, and each blade replaceable if problems develop.

Advanced packaging technology may be applied to reduce the dimensions of such a blade assembly. However, dissipating the heat generated in such a miniaturized version is difficult. It is helpful to make the blade as thin as possible. This provides short paths for the heat to escape from the integrated circuit chips inside to an external heat sink. In this manner, and employing advanced cooling methods, a Micro Blade assembly can effectively handle the approximately 500 watts of power associated with a high-end 4-way server. The Micro Blade package typically occupies less than 1% of the volume of a conventional blade device that is fabricated using packaged devices mounted on printed circuit boards. This type of result provides motivation for the Micro Blade form factor.

An example blade server is the HS40 manufactured by International Business Machines; it is 2.3 inches thick, 9.7 inches high, and 17.6 inches wide. The HS40 can be inserted into a chassis having 16 slots for similarly shaped blade components. The components may have different functions such as processor modules, or switch modules for high data rate communications to or from other components.

The HS40 includes up to 4 Xeon processors. Because these processors each generate up to 85 watts of heat during operation, they are provided with large and bulky finned aluminum heat sinks; and forced air passes over the fins to cool the processors. These heat sinks occupy approximately 40% of the HS40 blade volume. The total blade electronics requires 480 watts of cooling when four 3 GHz processors are installed. The HS40 also includes a power supply board, a controller board, and memory provided within serial in-line packages; it weighs 15.4 pounds and occupies 393 cubic inches.

SUMMARY OF THE INVENTION

The current invention implements the functions of a board or a blade in a micro-sized version. This micro-sized version preferably has a small thickness dimension and is referred to herein as a Micro Blade. The Micro Blade concept can be applied to a broad class of electronic components, including printed circuit boards, subsystems, system-in-package (SIP), and complete systems. It can be of any size. However, for the purpose of illustration, a particular size is described; this particular size resulting from shrinking the example HS40 device using advanced packaging techniques.

The Micro Blade version implements the same functions as the HS40 except for some minor differences in power distribution. The size of the preferred embodiment is 45×45×3.2 mm, with a corresponding weight of approximately 0.1 pounds. The corresponding volume is 0.4 cubic inches. Its thinness contributes to effective cooling.

The Micro Blade embodiment described herein is designed to use the same integrated circuit (IC) chips as the system it replaces. Consequently, it must dissipate the same amount of power, 480 watts in the case of the HS40 server example. In the preferred embodiment, this is achieved using a folded system-in-package (SIP) built on a copper foil substrate; copper comprises approximately 78% of the SIP volume, providing good heat transfer characteristics for cooling. By wrapping the SIP in a hermetic copper jacket it becomes a Micro Blade; a miniaturized stand-alone unit that can be connected to outside elements using a cable. It is mechanically rugged and also thermally rugged; "thermally rugged" means that it can effectively distribute localized hot spots and can also withstand brief surges in overall heat generation. It is preferably cooled in water or other liquid coolant, although air cooling is also a viable option by adding finned elements and forced air, as is known in the art. Yet another option is to provide heat pipes that carry heat produced in the copper jackets to remote radiators where it is dissipated using large area surfaces.

BRIEF DESCRIPTION OF THE DRAWINGS

The foregoing and other objects of the invention will be more clearly understood from the accompanying drawings and description of the invention.

DETAILED DESCRIPTION OF THE PREFERRED EMBODIMENTS

Figure 1:
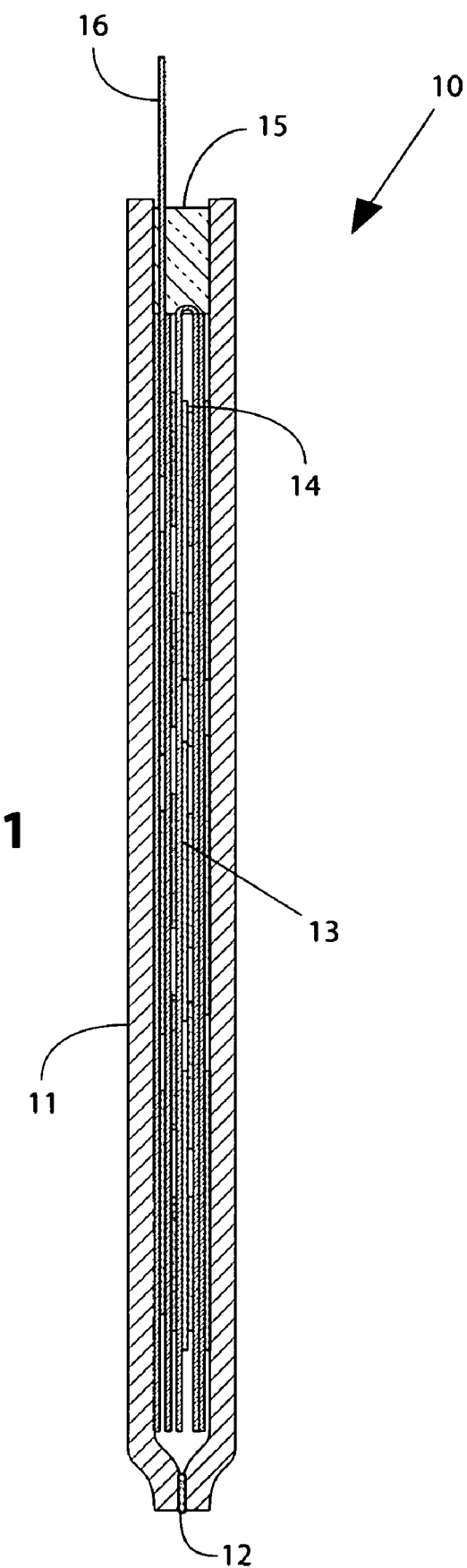
FIG. 1 is a cross-sectional view of a Micro Blade of the current invention at approximately 4× scale.

The cross-section of FIG. 1 illustrates Micro Blade 10 of the current invention, at a scale of approximately 4×. Micro Blade 10 can be of any size, but preferably has a thin form factor for ease of cooling the active circuits inside. Copper jacket 11 is soldered, welded, or brazed at crimped edges 12 to form a hermetic package. Inside the copper jacket is an electronic assembly that is preferably a folded system in package (SIP) 13 including IC chips 14. At the top of Micro Blade 10 is a semi-hermetic seal 15 that also provides a strain relief for cable 16. Semi-hermetic seal 15 may be formed using an epoxy adhesive or a potting compound, as is known in the art. Cable 16 connects to electronic assembly 13 using a direct attachment (like flip chip), as will be further described. Cable 16 also includes a section that is hermetic, as will be further described.

Figure 2:
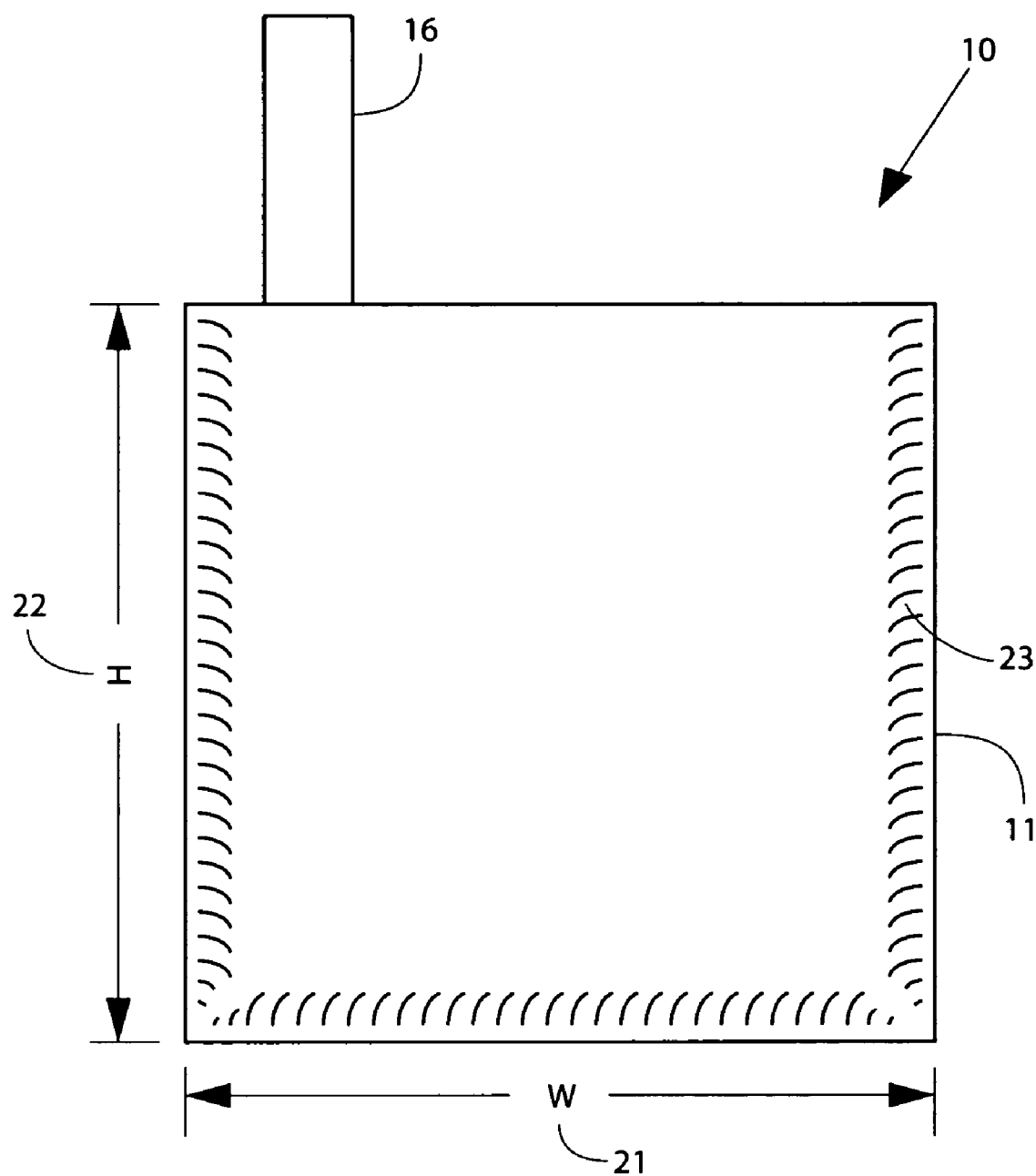
FIG. 2 shows a side view of the Micro Blade of FIG. 1 at approximately 2× scale.

FIG. 2 is a side view of Micro Blade 10, showing cable 16. Cable 16 typically carries power and high speed signals, as will be further described. Although any width and height are covered under the current invention, W 21 and H 22 are both 45 mm in the preferred embodiment. Pressure is applied to the copper sheets of hermetic jacket 11 to assure intimate contact with the circuit assembly inside, while the edges 23 are crimped together. Mating surfaces at the crimped edges are coated with solder paste, or a dry film of solder alloy is laminated between them. Heat and pressure are applied to melt the solder and make a watertight seal.

Figure 3A:
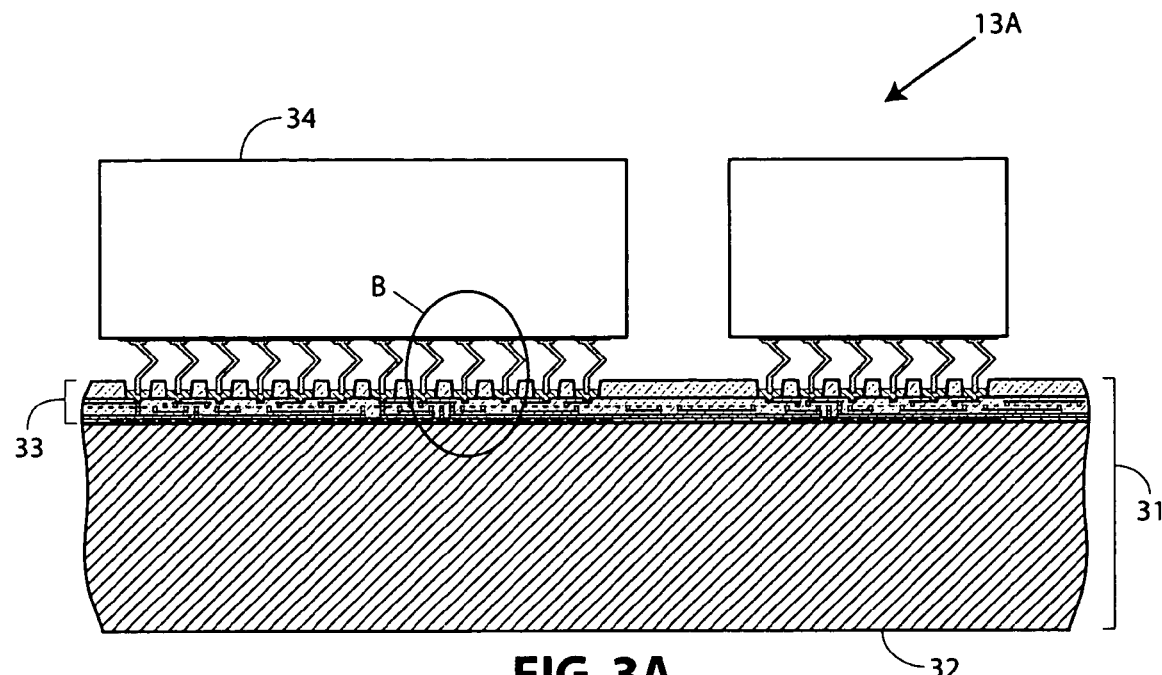
FIG. 3A shows a fragmentary cross-section of a circuit assembly fabricated on a copper substrate, that can be folded to form a system-in-package inside a Micro Blade.

FIG. 3A is a cross-sectional view of a fragment of a circuit assembly 13A. After fabrication, testing, and any necessary rework, assembly 13A will be folded to make circuit assembly 13 of FIG. 1, as will be further described. Assembly 13A includes foldable circuit board 31 formed on a copper foil substrate 32. Interconnection circuit 33 is preferably fabricated using build up dielectric and conducting layers, as is known in the art. In the preferred embodiment it includes dual damascene copper and dielectric structures that implement transmission lines having a characteristic impedance. The dual damascene structures may be fabricated using a combination of imprinting, electroplating, and chemical mechanical polishing (CMP). Further details of these processes are described in co-pending application Ser. No. 10/783,921 which is incorporated herein by reference.

Figure 3B:
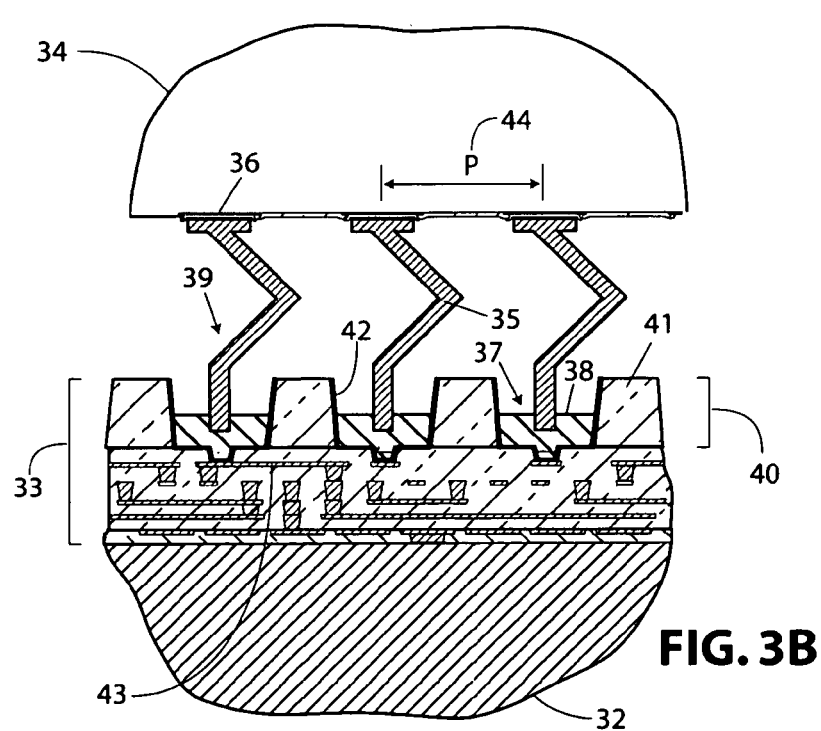
FIG. 3B is an expanded cross-sectional view of region B of FIG. 3A, including details of the flip chip connectors.

FIG. 3B is an expanded view of region B of FIG. 3A. It shows a fragment of IC chip 34 having copper spring bumps 35 attached at input/output pads 36. The copper spring bumps 35 are inserted into wells 37 containing solder paste that has been heated to form melted solder 38 in the wells. The solder in each well captures the end of a copper spring bump as shown, providing a strong mechanical connection and a low-resistance electrical connection. This flip chip connector is labeled 39 in FIG. 3B, and is a good stress reliever in all three dimensions. Such mechanical compliance is desirable for relaxing shear stresses caused by un-matched thermal expansion of IC chips versus circuit boards during temperature excursions. Vertical compliance of the spring elements is provided by a bend in spring element 35 as shown; this is additionally useful for accommodating imperfections in the components and in the assembly process. Co-pending application Ser. No. 11/015,213 describes the flip chip connectors in more detail, including methods for manufacture and assembly, and is incorporated herein by reference. Interconnection circuit 33 is shown built up on copper substrate 32, and includes a special assembly layer 40 in which the wells 37 are formed in a dielectric material 41. The walls 42 of the wells are coated with titanium/copper to provide a solder-wetting surface having good adhesion to dielectric material 41. Dielectric material 41 is preferably benzo-cyclo-butene (BCB). Flip chip connector 39 is shown connecting between an input/output pad 36 on IC chip 34 and a copper trace 43 in interconnection circuit 33. The minimum pitch 44 of flip chip connectors 39 is preferably around 80 μm.

Figure 4:
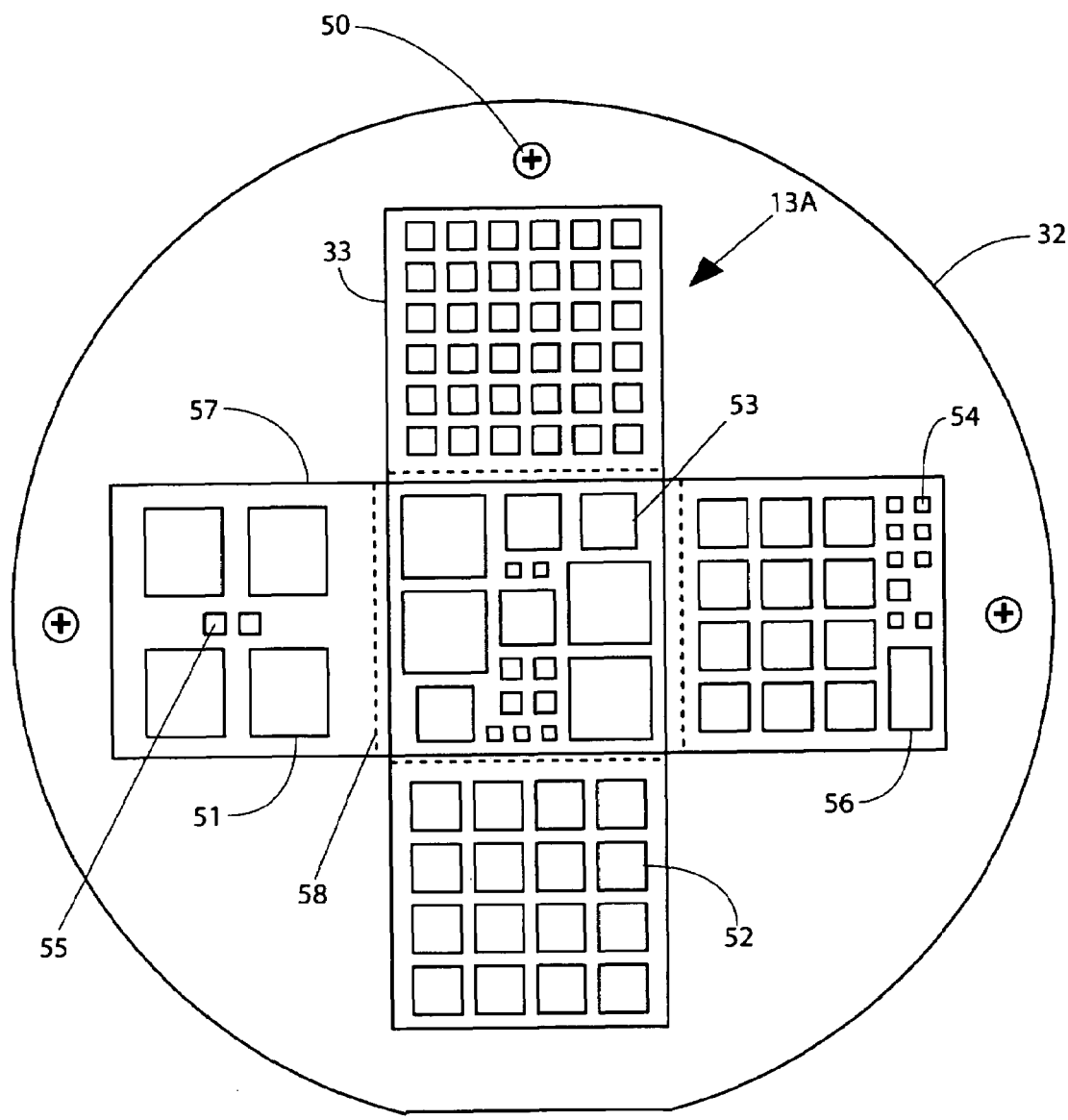
FIG. 4 is a top view of a system-in-package fabricated on a copper wafer, prior to folding.

FIG. 4 shows a complete layout for electronic assembly 13A of FIG. 3A. Assembly 13A is built on copper foil substrate 32 of FIG. 3A. For manufacturing convenience, substrate 32 may have the same shape and thickness as a silicon wafer. In this case the preferred wafer diameter is 150 mm; however, the wafer can be of any size. Interconnection circuit 33 of FIG. 3 has been fabricated on copper substrate 32, with clear areas surrounding alignment targets 50. The set of chips in assembly 13A is a chipset that implements a 4-way server in this example, including 4 processor chips 51, arrays of memory chips 52, a test chip 53, integrated passives 54, and power distribution devices 55. An area 56 is shown for attaching cable 16 of FIG. 1. Assembly 13A is tested and any defective chips are replaced. Test chip 53 and cable 16 are used during testing, employing methods described in co-pending application Ser. No. 10/448,611 incorporated herein by reference. A back grinding and lapping procedure is preferably employed to reduce the thickness of all of the chips to approximately 100 microns. Copper substrate 32 may also be thinned using a grinding/lapping procedure, and the wings 57 of assembly 13A are folded at fold lines 58 to form electronic assembly 13 of FIG. 1. More details about the folding and the associated system-in-package are described in co-pending application Ser. No. 10/783,163, incorporated herein by reference.

Figure 5:
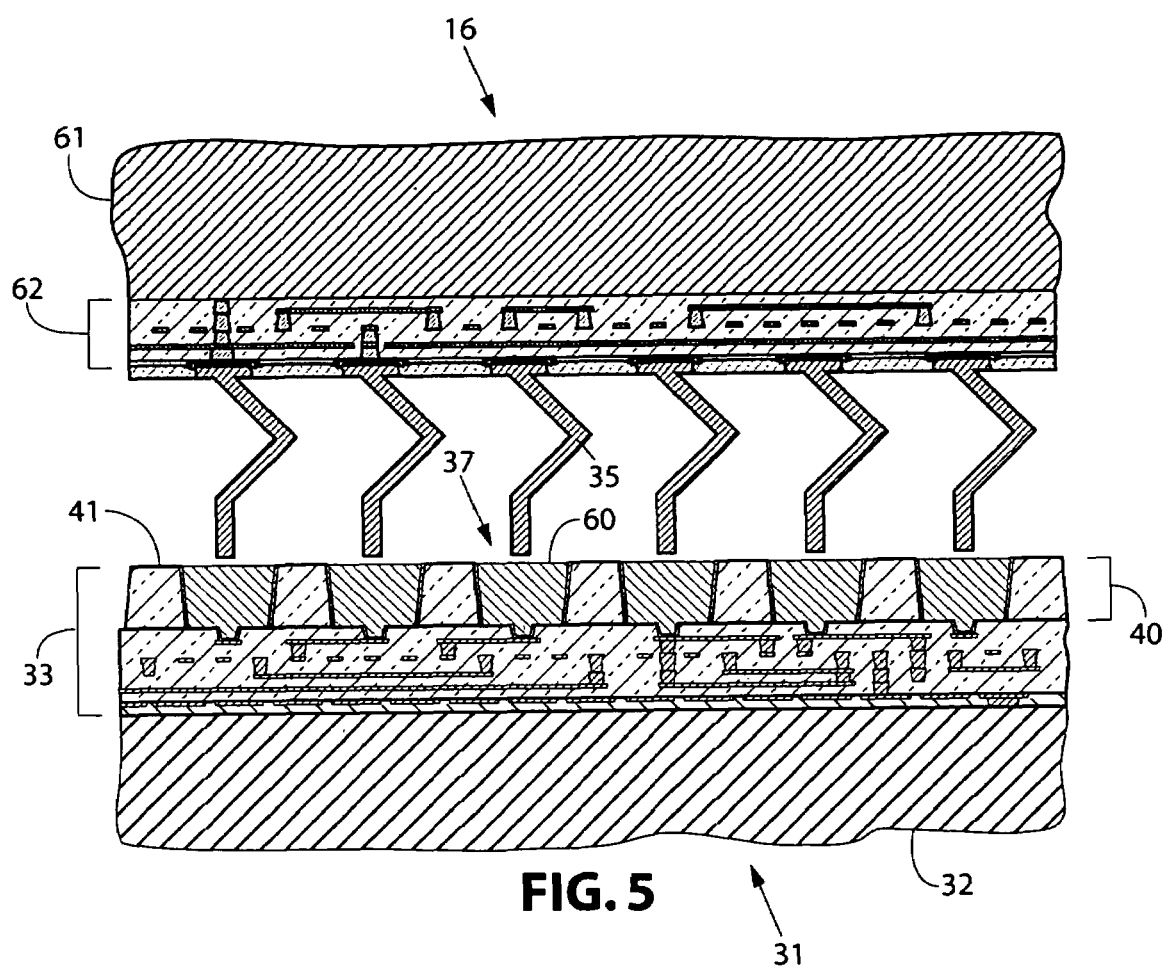
FIG. 5 shows a fragmentary cross-section of a cable aligned with a circuit assembly, just prior to physical attachment.

FIG. 5 illustrates in cross-section the situation just prior to bonding cable 16 of FIG. 1 to foldable circuit board 31 of FIG. 3A using flip chip connectors 39 described in reference to FIG. 3B. The attachment procedure is similar to that used for attaching an IC chip like 34 of FIG. 3A. A flip chip bonding machine employing split beam optics is used, having an alignment accuracy of approximately ±1 micron. Copper spring bumps 35 are shown aligned to wells 37 containing solder paste 60 that has been deposited in the wells using a squeegee. Copper substrate 32 of foldable circuit board 31 and copper substrate 61 of cable 16 are preferably connected to ground (GND). For high-speed signals, offset coplanar striplines are implemented in interconnection circuit 62 of cable 16, providing a preferred characteristic impedance of 50 ohms. The preferred pitch between flip chip connectors is around 80 microns, as discussed in reference to FIG. 3B. Having a preferred height of approximately 100 μm, the flip chip connectors have an inductance of approximately 0.1 nH, supporting signaling at multi-gigahertz rates between the Micro Blade and external devices.

Figure 6A:
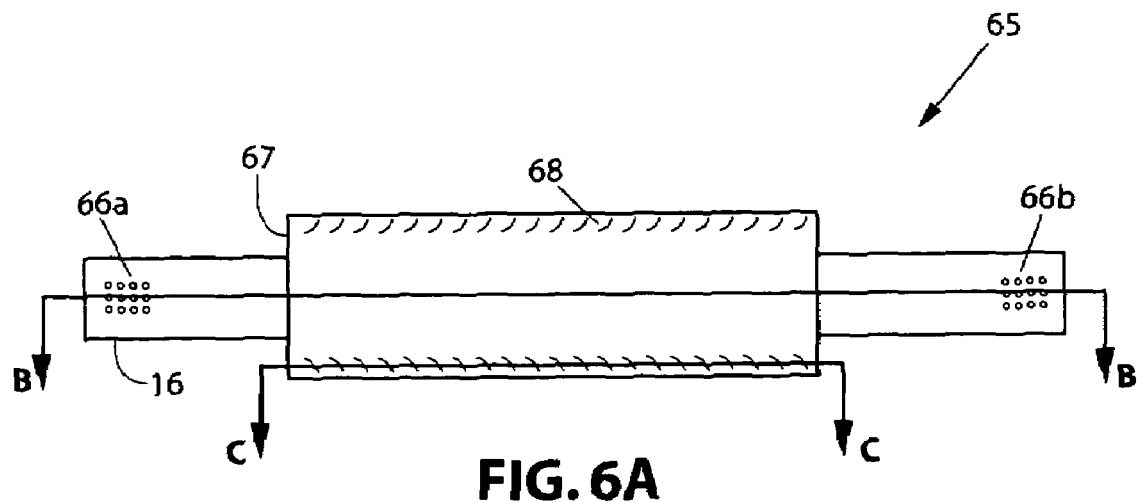
FIG. 6A is a schematic top view of a hermetic cable of the current invention.
Figure 6B:
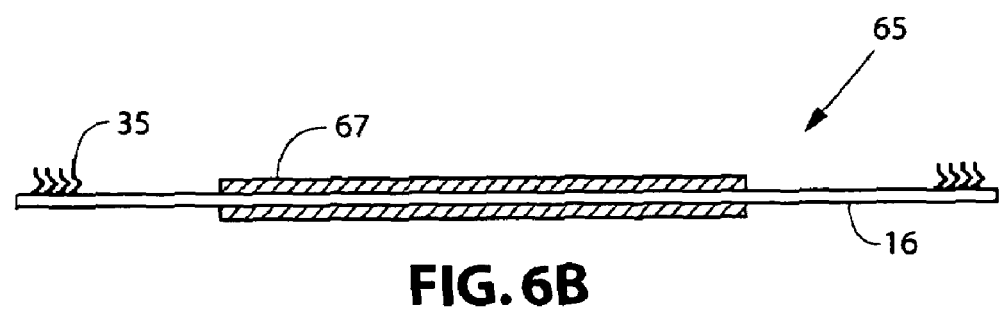
FIG. 6B is a cross-section shown as BB in FIG. 6A.
Figure 6C:
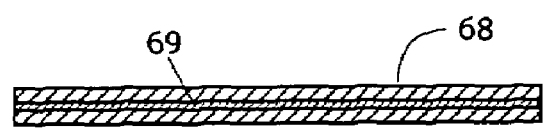
FIG. 6C is a cross-section shown as CC in FIG. 6A.

FIG. 6A shows hermetic cable 65 including cable 16 of FIG. 1. Cable 16 has arrays 66a and 66b of copper spring elements as described in FIG. 3B. Array 66a connects to the electronic assembly or SIP inside Micro Blade 10 of FIG. 1, and array 66b typically connects to a back plane, to be further described. A copper sheath 67 encloses a center portion of cable 16 as shown, and is crimped at the edges 68. FIG. 6B illustrates section BB of FIG. 6A. Copper spring elements 35 of array 66a are shown. Copper sheath 67 is preferably fabricated from sheets of copper foil approximately 600 microns thick. FIG. 6C illustrates section CC of FIG. 6A, and shows that the seam in copper sheath 67 is hermetically sealed, preferably using solder 69. The center hermetic portion of hermetic cable 65 can be used to traverse a damp or steam-laden path of cable 16, as will be further described; each end will preferably be dry, where the flip chip connections are made.

Figure 7:
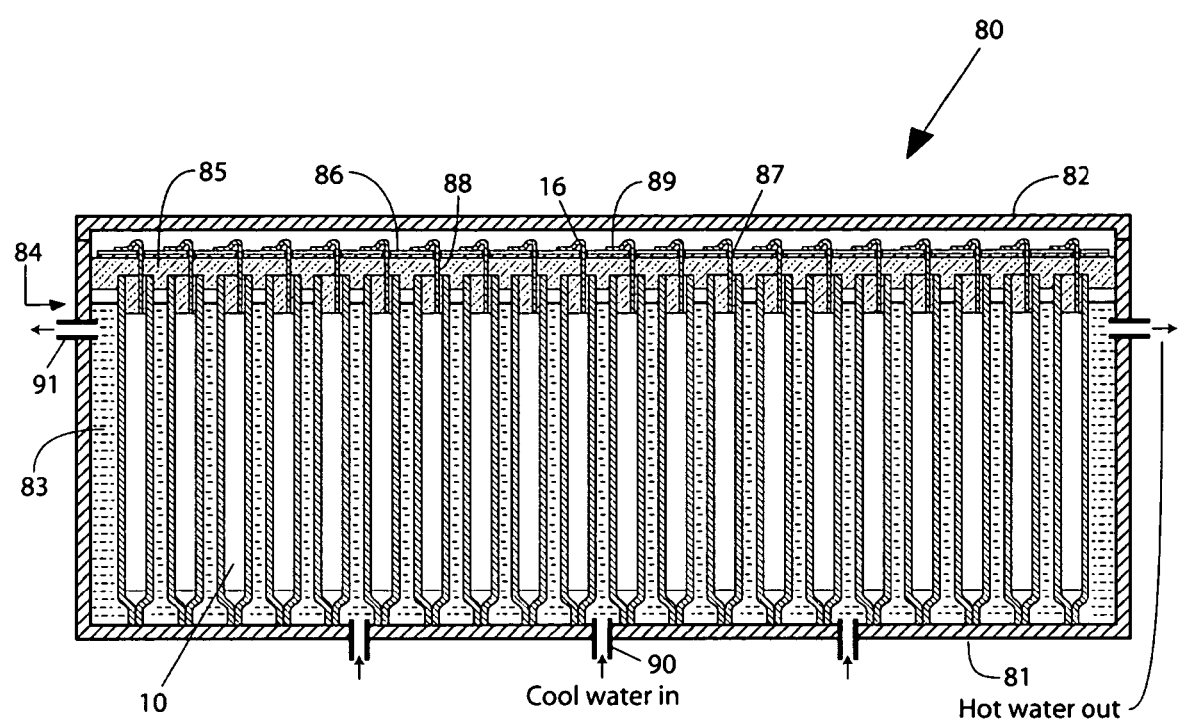
FIG. 7 is a cross-sectional view of a water-cooled system of the current invention.

FIG. 7 shows a water-cooled electronic system 80 of the current invention in cross-section. System 80 includes a tank 81 having a lid 82. Tank 81 is filled with water 83 to a controlled level 84. An array of Micro Blade elements 10 is inserted in tank 80 as shown. Although Micro Blade elements have a preferred form factor, any hermetic sub-assembly can be similarly immersed for cooling. Partial immersion is preferred as shown, wherein a hermetic jacket protects on all sides against water intrusion. A water seal 85 is provided for tank 81 as shown, preferably consisting of potting material. Back plane printed circuit board 86 is shown in a dry environment; this board may be a conventional laminate board constructed from glass fibers and epoxy, or it may be constructed on a copper substrate as shown in FIG. 3A; in either case it preferably includes wells filled with solder for accepting copper spring elements 66b of FIG. 6A at the end of cable 16. Circuit board 86 may also be a motherboard for integrating electronic activity among all of the Micro Blades or sub-assemblies. Circuit board 86 preferably has slots 87 through which the Micro Blade cables pass. Section 88 of cable 16 of FIG. 1 passes through the potting material of water seal 85. Such potting materials are not totally impervious to moisture, and this is why the seal is only "semi-hermetic". Residual moisture will likely cause a reliability problem with copper conductors on a cable passing through such a potting material; eventually the metallic conductors will corrode. This is the motivation for creating a cable 16 having a center section that is fully hermetic, as described in reference to FIG. 6A. The center hermetic section of the cable protects the cable conductors from residual moisture, either in potting material 15 of FIG. 1 or material 85 of FIG. 7. Connections 89 between Micro Blade cables 16 of FIG. 1 and back plane 86 are preferably constructed as flip chip connections, as described in reference to FIG. 5. Other types of flip chip connectors may also be used. For example, solder bumps may replace copper spring elements at the ends of cable 16; they may connect to wells filled with solder, or to corresponding lands on circuit board 86. A further alternative is to provide pin-and-socket connectors at this end of the cable attachment.

For corrosion protection, it may be desirable to plate the outer surfaces of the hermetic jackets 11 of FIG. 1 with a thin layer of nickel followed by a thin layer of gold, as is known in the art.

The water 83 in tank 80 is preferably circulated through a cooling system (not shown), as is known in the art. Water entry ports 90 and exit ports 91 are shown. Since water has a specific heat of 4.186 Joules per gram per degree Centigrade, a flow rate of 20 liters per minute will provide over 62 kilowatts of cooling if the water temperature rises by 45° C. The Micro Blades are thermally well coupled to the coolant, since the water is circulating in contact with the jacket surfaces. A typical desired maximum junction temperature for the electronic circuits contained inside of a Micro Blade is 85° C. and a typical temperature for the chilled water is 15° C. A thermal resistance $\theta_{JC}$ from junction to case of less than 0.05° C./W is achievable for a Micro Blade of the current invention, as well as heat dissipation exceeding 5 watts per square millimeter of the Micro Blade jacket.

Maintenance of Micro Blades 10 in water-cooled system 80 is difficult; the Micro Blades are semi-permanently attached using potting material 85. Accordingly, a preferred maintenance philosophy includes monitoring the health of the Micro Blades and adding isolation circuits to each; defective ones are switched out of operation without adversely affecting the remaining good units. In a data center for example, stacks of water-cooled systems 80 may be provided. Their total compute and switching power will depend on the total number of Micro Blades in service. This is preferably managed by adding or subtracting systems 80 to meet the peak demand over the long term.

What is claimed is:

1. A method for cooling an electronic assembly comprising the steps of: miniaturizing said electronic assembly in the form of a micro blade;
   providing an enclosure for said micro blade comprising a hermetically sealed metal jacket having an open end filled with potting material;
   providing a connecting cable passing through said potting material;
   providing cooling fluid in a tank and;
   partially immersing said metal jacket in said cooling fluid.

2. A system integration of electronic sub-assemblies comprising:
   a tank of cooling fluid in which said sub-assemblies are partially immersed;
   a sealing layer of potting material positioned above said fluid in said tank, through which connecting cables of said sub-assemblies pass; and,
   a backplane or mother board situated above said sealing layer of potting material, to which said connecting cables attach.

3. The system of claim 2 wherein said cooling fluid is water.

4. A thermal architecture for an electronic system comprising:
   electronic sub-assemblies that require cooling;
   a jacket of thermally conductive material having hermetic seams enclosing each of said electronic sub-assemblies, and having an open end;
   potting material in said open end, through which a connecting cable of said sub-assembly passes;
   a tank of cooling fluid in which said sub-assemblies are partially immersed;
   a sealing layer of potting material positioned above said fluid in said tank, through which said connecting cables of said sub-assemblies pass; and,
   a backplane or motherboard situated above said layer of potting material sealing said tank, to which said connecting cables attach.

* * * * *